United States Patent
Park et al.

(10) Patent No.: US 9,024,403 B2
(45) Date of Patent: May 5, 2015

(54) IMAGE SENSOR PACKAGE

(71) Applicant: Samsung Electronics Co., Ltd., Suwon-si (KR)

(72) Inventors: Tae Sang Park, Seoul (KR); Hyo Young Shin, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 13/870,453

(22) Filed: Apr. 25, 2013

(65) Prior Publication Data
US 2013/0285185 A1 Oct. 31, 2013

(30) Foreign Application Priority Data

Apr. 25, 2012 (KR) .................. 10-2012-0043146

(51) Int. Cl.
*H01L 27/148* (2006.01)
*G02B 6/12* (2006.01)
*H01L 27/146* (2006.01)

(52) U.S. Cl.
CPC .... *H01L 27/14636* (2013.01); *H01L 27/14618* (2013.01)

(58) Field of Classification Search
CPC .................. H01L 27/14636; H01L 27/14618
USPC .......... 257/432, 433, 434, 750, 777, E31.117, 257/E31.127, E25.013; 348/340, E5.027; 385/14, 33; 438/1, 612; 250/208.1
See application file for complete search history.

(56) References Cited

U.S. PATENT DOCUMENTS

| | | | |
|---|---|---|---|
| 6,396,116 B1 * | 5/2002 | Kelly et al. | 257/432 |
| 6,627,864 B1 * | 9/2003 | Glenn et al. | 250/208.1 |
| 6,774,481 B2 * | 8/2004 | Ono | 257/704 |
| 7,539,366 B1 * | 5/2009 | Baks et al. | 385/14 |
| 2003/0071342 A1 | 4/2003 | Honda et al. | |
| 2005/0279916 A1 * | 12/2005 | Kang et al. | 250/208.1 |
| 2007/0054419 A1 * | 3/2007 | Paik et al. | 438/1 |
| 2008/0083980 A1 | 4/2008 | Yang et al. | |

(Continued)

FOREIGN PATENT DOCUMENTS

| | | |
|---|---|---|
| JP | 2005-242242 | 9/2005 |
| KR | 10-2005-0116760 | 12/2005 |
| KR | 10-2011-0117486 | 10/2011 |

OTHER PUBLICATIONS

Partial European Search Report issued Jun. 25, 2013 in corresponding European Application No. 13165357 8.

(Continued)

*Primary Examiner* — Dao H Nguyen
(74) *Attorney, Agent, or Firm* — Staas & Halsey LLP

(57) ABSTRACT

An image sensor package and image sensor chip capable of being slenderized while enhancing the reliability with respect to physical impact are provided. The image sensor package includes an image sensor chip provided with a pixel domain at a central portion of an upper surface thereof, a substrate disposed at an upper side of the image sensor chip so as to be flip-chip bonded with respect to the image sensor chip, provided with a hole formed at a position corresponding to the pixel domain, and formed of organic material, a printed circuit board at which the substrate provided with the image sensor chip bonded thereto is mounted, and a solder ball configured to electrically connect the substrate to the printed circuit board.

12 Claims, 9 Drawing Sheets

(56) References Cited

U.S. PATENT DOCUMENTS

2011/0193231 A1    8/2011    Elenius et al.
2012/0242883 A1*  9/2012    Pavithran et al. ............ 348/340

OTHER PUBLICATIONS

Extended European Search Report mailed Nov. 4, 2013 in related European Application No. 13165357.8.

* cited by examiner

RELATED ART

IMAGE SENSOR PACKAGE

CROSS-REFERENCE TO RELATED APPLICATIONS

This application is related to, and claims priority to, the Korean Patent Application No. 10-2012-0043146, filed on Apr. 25, 2012, in the Korean Intellectual Property Office, the disclosure of which is incorporated herein by reference.

BACKGROUND

1. Field

Embodiments of the present disclosure relate to an image sensor package.

2. Description of the Related Art

An image sensor may be a semiconductor device configured to detect information on a subject and to convert the detected information into an electrical image signal. An image sensor may be installed in a digital camera or a camcorder, as well as in a tablet PC or a mobile phone. Thus, the market thereof is rapidly expanding. The image sensor may include a CCD (Charge Coupled Device) and/or a CMOS (Complementary Metal Oxide Silicon).

Optical electronics device such as the image sensor may be packaged so as to be connectable to a higher-level package such as a larger circuit assembly. An image sensor package may be configured to provide an electrical connection to a larger circuit assembly, protect an image sensor chip from surrounding environment, and allow direct and/or reflective light to be transmitted. The light may enter the image sensor package at a sensing circuit located at the image sensor chip.

As the semiconductor industry continues to develop, various packaging methods are being developed by semiconductor manufacturers to produce semiconductor components that are smaller, faster, and reliable. Particularly, in a market in which a light weight, slim, simple, and miniaturized product are demanded by the consumer including a mobile phone provided with a camera mounted thereto, an image sensor package applied with a Chip-On-Board (COB) method or a Chip-On-Glass (COG) method is being widely used.

FIG. 1 illustrates a cross-sectional view of an image sensor package provided with a conventional Chip-On-Board method applied thereto.

As illustrated on FIG. 1, an image sensor package 100 provided with a conventional Chip-On-Board method applied thereto includes an image sensor chip 110, a printed circuit board (PCB) 140 on which the image sensor chip 110 is mounted, support members 130 installed at border portions of the printed circuit board 140, and a transparent substrate 120 attached to the support members 130.

The image sensor chip 110 includes a pixel domain 110a provided at a central portion of an upper surface thereof, and bonding pads 111 provided at outer sides of the pixel domain 110a.

As illustrated on FIG. 1, the image sensor package 100 provided with a conventional Chip-On-Board method applied thereto is manufactured as the bonding pads 111 formed at an upper surface of the image sensor chip 110 are connected to bonding pads 141 formed at an upper surface of the printed circuit board 140 by use of bonding wires 150, after the image sensor chip 110 is attached to an upper surface of the printed circuit board 140 by using die adhesive. The transparent substrate 120, which is provided with a glass-like material capable of physically protecting the image sensor chip 110 and the bonding wires 150, is attached to the support members 130, while configured in a way that light may be transmitted therethrough.

The Chip-On-Board method has a high cost of production due to a wire bonding process. The overall height or the thickness of the image sensor package 100 is increased due to the height of the bonding wire, which is approximately in the range between 700 µm and 800 µm. Thus, producing a slenderized image sensor package is difficult.

FIG. 2 is a cross-sectional view of an image sensor package provided with a conventional Chip-On-Glass method applied thereto.

As illustrated on FIG. 2, the image sensor package 100 provided with a conventional Chip-On-Glass method applied thereto includes an image sensor chip 210, a transparent substrate 220 disposed facing an upper portion of the image sensor chip 210 and electrically connected to the image sensor chip 210, a printed circuit board 240 at which the transparent substrate 220 is mounted, and a solder part 230 configured to electrically connect the image sensor chip 210, the transparent substrate 220, and the printed circuit board 240 to one another. The solder part 230 includes solder sealing rings 232 configured to prevent a foreign substance from being introduced into the sealing domain having the pixel domain 210a of the image sensor chip 210, a plurality of solder bumps 231 configured to electrically connect the image sensor chip 210 to the transparent substrate 220, and a plurality of solder balls 233 configured to electrically connect the transparent substrate 220 to the printed circuit board 240.

The image sensor chip 210 includes a pixel domain 210a provided at a central portion of an upper surface thereof, and solder sealing ring pads 212 and solder bump pads 211 provided at outer sides of the pixel domain 210a.

The transparent substrate 220 provided with glass-like material includes metallic wiring 221 selectively formed at a lower surface thereof, insulation films 223 formed on the metallic wiring 221 and configured to insulate the metallic wiring 221, and solder sealing ring pads 222 formed at a predetermined domain of the transparent substrate 220.

As illustrated in FIG. 2, the image sensor package 200 having a conventional Chip-On-Glass method applied thereto is manufactured as the image sensor chip 210 is mounted at the transparent substrate 220 in a way that the pixel domain 210a formed at a central portion of an upper surface of the image sensor chip 210 is facing a lower surface, which is a wiring forming surface, of the transparent substrate 220. Then the transparent substrate 220, provided with the image sensor chip 210 mounted thereto, is mounted at the printed circuit board 240. The image sensor chip 210 is electrically connected to the transparent substrate 220 through the solder bump 231, and the transparent substrate 220 and the printed circuit board 240 are electrically connected to each other through the solder balls 233.

The Chip-On-Glass method does not require the wire bonding process, which is used at the Chip-On-Bonding method, and thus the processing cost may be reduced, and since no bonding wire is being used, slenderization of the image sensor package may be possible. However, the image sensor package manufactured with the Chip-On-Glass method may be vulnerable to physical impact due to the low elastic strain of the image sensor chip and the transparent substrate.

SUMMARY

It is an aspect of the present disclosure to provide an image sensor package capable of enhancing the reliability thereof with respect to physical impact while the slenderization thereof may be possible by changing the material and/or the structure of the substrate, at which an image sensor chip is mounted, in the structure of the image sensor package provided with a Chip-On-Glass method applied thereto.

It is an aspect of the present disclosure to provide an image sensor capable of reducing the cost of processing by changing the material and/or the structure of the substrate, at which an image sensor chip is mounted, in the structure of the image sensor package provided with a Chip-On-Glass method applied thereto.

Additional aspects of the disclosure will be set forth in part in the description which follows and, in part, will be obvious from the description, or may be learned by practice of the disclosure.

In accordance with an embodiment of the present disclosure, an image sensor package includes an image sensor chip, a substrate, a printed circuit board, and a solder ball. The image sensor chip may be provided with a pixel domain at a central portion of an upper surface thereof. The substrate may be disposed at an upper side of the image sensor chip so as to be flip-chip bonded to the image sensor chip, provided with a hole formed at a position facing the pixel domain, and formed of organic material. The printed circuit board may have the substrate, which has the image sensor chip bonded thereto, mounted thereto. The solder ball may be configured to electrically connect the substrate to the printed circuit board.

The organic material may be material that has a coefficient of thermal expansion similar to a coefficient of silicon wafer material, and may be capable of elastic deformation.

The image sensor chip may include a solder bump pad formed at an outer side of the pixel domain.

The image sensor package may include a solder bump. The solder bump may be formed on the solder bump pad of the image sensor chip, wherein the image sensor chip is flip-chip bonded to the substrate by the solder bump.

The image sensor package may include sealing resin. The sealing resin may be formed at a surrounding area of the solder bump in between the image sensor chip and the substrate to prevent foreign substance from being introduced to an inside the pixel domain of the image sensor chip.

A transparent substrate, on which an IR cutoff filter configured to transmit or block light having a particular wavelength band is coated, may be attached to an upper surface of the substrate.

In accordance with an aspect of the present disclosure, an image sensor package includes an image sensor chip, a substrate, and a protective case. The image sensor chip may be provided with a pixel domain at a central portion of an upper surface thereof. The substrate may be disposed at an upper side of the image sensor chip so as to be flip-chip bonded to the image sensor chip, provided with a hole formed at a position corresponding to the pixel domain, provided with multilevel interconnection formed thereto, and formed of organic material. The protective case may be formed at a lower surface of the substrate to protect the image sensor chip.

The organic material may represent material that has a coefficient of thermal expansion similar to a coefficient of thermal expansion of silicon wafer material, and capable of elastic deformation.

The image sensor chip may include a solder bump pad formed at an outer side of the pixel domain.

The image sensor package may further include a solder bump formed on the solder bump pad of the image sensor chip, wherein the image sensor chip is flip-chip bonded to the substrate by the solder bump.

The image sensor package may include sealing resin formed at a surrounding area of the solder bump in between the image sensor chip and the substrate to prevent foreign substance from being introduced to an inside the pixel domain of the image sensor chip.

A transparent substrate, on which an IR cutoff filter configured to transmit or block the light having a particular wavelength band is coated, may be attached at an upper surface of the substrate.

In accordance with an exemplary embodiment of the image sensor package, the image sensor package can enhance the reliability thereof with respect to physical impact while the slenderization thereof may be possible by changing the material and/or the structure of the substrate, at which an image sensor chip is mounted, in the structure of the image sensor package provided with a Chip-On-Glass method applied thereto.

In addition, the image sensor package can reduce the cost of processing by changing the material and/or the structure of the substrate, at which an image sensor chip is mounted, in the structure of the image sensor package provided with a Chip-On-Glass method applied thereto.

BRIEF DESCRIPTION OF THE DRAWINGS

These and/or other aspects of the disclosure will become apparent and more readily appreciated from the following description of the embodiments, taken in conjunction with the accompanying drawings of which.

DETAILED DESCRIPTION

Figure 1:
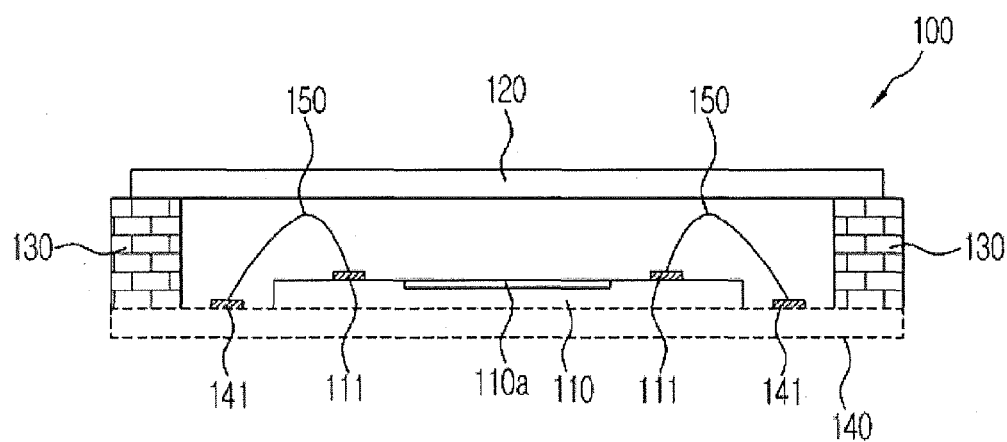
FIG. 1 is a cross-sectional view of an image sensor package provided with the conventional Chip-On-Board method applied thereto.
Figure 2:
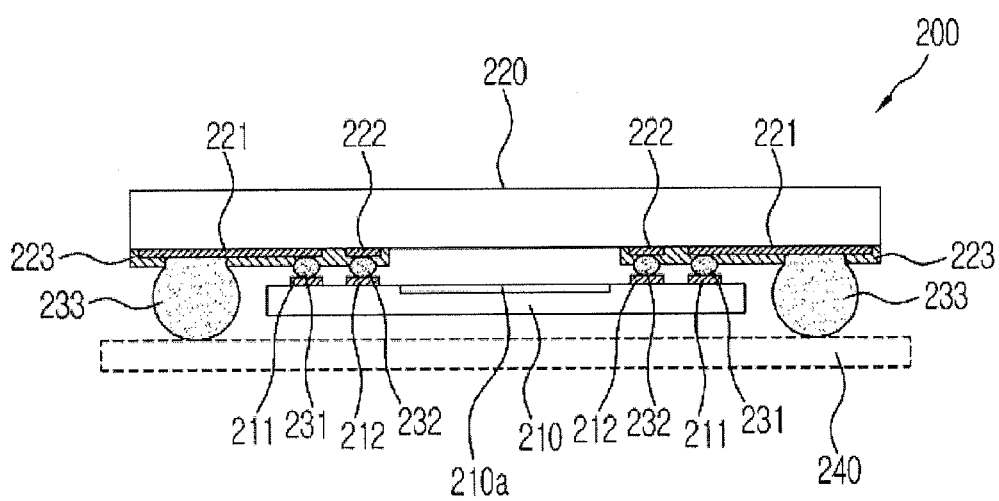
FIG. 2 is a cross-sectional view of an image sensor package provided with the conventional Chip-On-Glass method applied thereto.

Reference will now be made in detail to the embodiments of the present disclosure, examples of which are illustrated in the accompanying drawings, wherein like reference numerals refer to like elements throughout.

Figure 3:
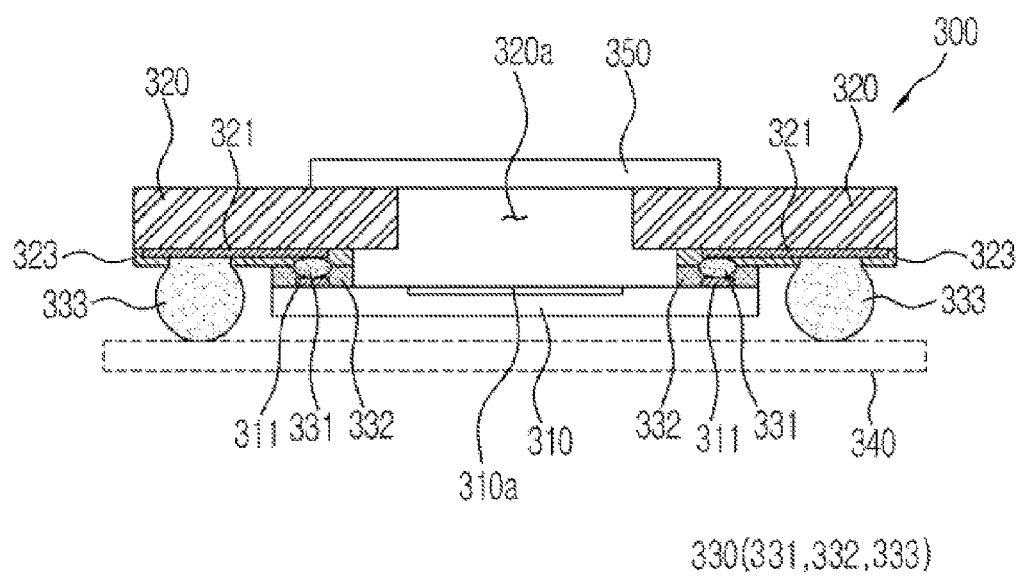
FIG. 3 is a cross-sectional view of an exemplary image sensor package in accordance with an embodiment of the present disclosure.

FIG. 3 is a cross-sectional view of an image sensor package in accordance with an embodiment of the present disclosure.

As illustrated on FIG. 3, an image sensor package 300 in accordance with an embodiment of the present disclosure includes an image sensor chip 310, a substrate 320 disposed at an upper side of the image sensor chip 310 so as to be flip-chip bonded to the image sensor chip 310, a printed circuit board 340 at which the substrate 320 provided with the image sensor chip 310 bonded thereto is mounted, a solder part 330 configured to electrically connect the substrate 320 provided with the image sensor chip 310 mounted thereto to the printed circuit board 340, and a transparent substrate 350 on which glass-like material having, for example, an IR cutoff filter (not shown), is coated.

The image sensor chip 310 includes a pixel domain 310a provided at a central portion of an upper surface thereof, and solder bump pads 311 provided at an outer side of the pixel domain 310a. The pixel domain 310a is a domain to sense and/or photograph. At the pixel domain 310a, for example, a plurality of photo diodes configured to convert light into an electrical signal, a filter, for example, a three-color filter of red, green, and blue provided at each photo diode capable of distinguishing colors, and a lens, for example, a micro lens provided on the color filter and configured to enhance the reception of light by concentrating the light at each photo diode may be stacked to form the pixel domain 310.

The substrate 320 to which the image sensor chip 310 is bonded includes metallic interconnections 321 selectively formed at a lower surface of the substrate 320, at which the image sensor chip 310 is mounted. Insulation film 323 may be formed on the metallic interconnection 321 and configured to insulate the metallic interconnection 321. At a lower surface of the substrate 320, a circuit pattern (not shown) may be formed.

The substrate 320 to which the image sensor chip 310 is bonded may be manufactured in a shape of a plate having a predetermined thickness, The material of the substrate 320, other than the glass-like transparent material that may be used in a Chip-On-Glass method, may be organic material provided with a similar coefficient of thermal expansion to silicon wafer (Si wafer) material, for example, a package substrate, a S3 substrate, or an organic wafer substrate. With the organic material, by using a RDL (Redistributed Layer) process, which is a post process of semiconductors, a fine pitch interconnection each having a minimum line width of about 10 µm and a minimum line interval of about 10 µm may be formed, so that a substrate may be manufactured. The organic material may be elastically deformed, and thus, if the image sensor package 300 is manufactured by using the substrate 320 structured with the organic material, the image sensor package 300 may not easily be damaged by physical impact. The substrate 320 at which the image sensor chip 310 may be mounted may be provided at a central portion thereof with a hole 320a, having a size sufficient to expose the pixel domain 310a of the image sensor chip 310 to an outside. The organic material being used as the material of the substrate 320 may be non-transparent material, and thus the hole 320a formed at the substrate 320 allows light to transmit to the pixel domain 310a of the image sensor chip 310. Since the hole 320a may be formed at the substrate 320, even in a case when physical impact is applied from an outside, the potential damage by the collision between the image sensor chip 310 and the substrate 320 may be prevented. Thus, the reliability with respect to physical impact is enhanced.

A transparent substrate 350 formed of glass-like material coated with optical material to enhance the reception of light or to filter light may be attached to a surface of the substrate 320 at which the metallic interconnection 321 is formed or to a surface of the substrate 320 at which the metallic interconnection 321 is not formed. The material of the transparent substrate 350 may be, for example, glass or polymer material. For example, a transparent glass substrate coated with an IR cutoff filter (not shown) or a polymer film (not shown), which is configured to transmit or block the light having a particular wavelength band, may be attached to the opposite surface of the substrate at which light is incident. The metallic interconnection 321 may be formed at a lower surface of the substrate 320. The metallic interconnection 321 may be provided in the form of a pattern through a printing process, or may be subject to a patterning through a photo process and an etching process after metallic material is deposited. At the metallic interconnection 321, an insulation layer 323 may be formed while exposing a predetermined domain of the metallic interconnection 321. That is, by the insulation layer 323, a portion of the domain of the metallic interconnection 321, which is connected to the image sensor chip 310 and the printed circuit board 340, is exposed. The insulation layer 323 may be provided in the form of a pattern through a printing process, or may be subject to a patterning through a photo process and an etching process after metallic material is deposited.

The solder part 330 includes a sealing resin 332 configured to prevent foreign substance from being introduced into a sealing domain having the pixel domain 310a of the image sensor chip 310, a plurality of solder bumps 331 configured to electrically connect the image sensor chip 310 to the substrate 320, and a plurality of solder balls 333 configured to electrically connect the substrate 320 to the printed circuit board 340.

The sealing resin 3320, that is, the polymer resin, for example, an underfill, may be formed to surround the sealing domain including the pixel domain 310a of the image sensor chip 310 in between the image sensor chip 310 and the substrate 320, and prevents foreign substance from being introduced to the sealing domain, in particular, to an inside of the pixel domain 310a of the image sensor chip 310. The sealing resin 332 may be coated (filling) and cured at the surrounding area of the solder bumps 331 in between the image sensor chip 310 and the substrate 320. The sealing resin 332 may be formed in a way not to interfere the pixel domain 310a of the image sensor chip 310.

A manufacturing process of an image sensor package is needed to be performed under an environment provided with high level of cleanliness to prevent foreign substances, such as bump material, from being introduced into an inside of the pixel domain of an image sensor chip. Thus, during the manufacturing process of the image sensor package as such, a clean room may be provided with high level of cleanliness, as well as various equipment configured to maintain the environment provided with high level of cleanliness. However, the substrate 320 forming the image sensor package 300 in accordance with an embodiment of the present disclosure may be provided with the hole 320a formed at a position facing the pixel domain 310a of the image sensor chip 310, and thus, even in a case when foreign substance such as bump material may be introduced into the pixel domain 310a of the image sensor chip 310, the transparent substrate 350 is attached after removing the foreign substance through the hole 320a. Thus, a clean room and the various equipment configured to maintain the environment provided with high level of cleanliness may not be needed. Thus, the manufacturing process of the image sensor package may be simplified, and thus the manufacturing cost may be reduced.

A plurality of solder bumps 331 may be formed in between the substrate 320 and the image sensor chip 310. Solder bump pads 311 may be formed at a predetermined domain of the image sensor chip 310 to form the solder bumps 331. The solder bumps 331 may be formed in between the metallic interconnection 321 of the substrate 320 and the solder bump pads 311 on the image sensor chip 310.

The plurality of solder balls 333 may be welded at the metallic interconnection 321 of the substrate 320 at an outer side of the image sensor chip 310, and electrically connect the substrate 320 to the printed circuit board 340. The plurality of solder balls 333, for example, is formed at an equal interval with respect to each other along the outskirt of the substrate 320 having the shape of a rectangle.

The printed circuit board 340 may be connected to the solder balls 333 by a connection pad, and since a circuit pattern is printed at the printed circuit board 340, driving voltage and current from an outside are supplied to the image sensor chip 310 through the substrate 320. The printed circuit board 340 may be provided in various shapes thereof, such as a single-layer printed circuit board, multiple-layer printed circuit board, a metallic printed circuit board, and a flexible printed circuit board, to supply driving voltage and current from an outside to the image sensor chip 310.

FIGS. 4A to 4J illustrate an exemplary manufacturing process of an image sensor package in accordance with an embodiment of the present disclosure.

Figure 4A:
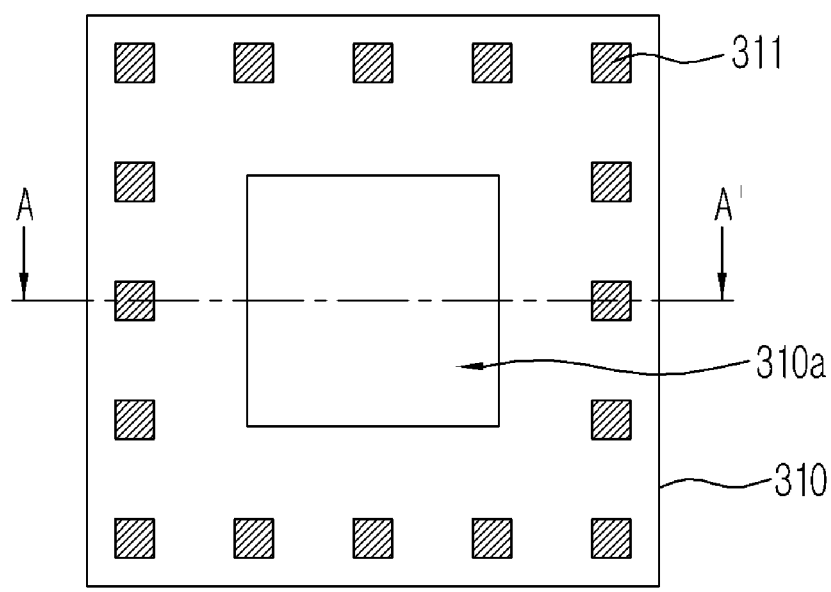
FIGS. 4A to 4J illustrate an exemplary manufacturing process of an image sensor package in accordance with an embodiment of the present disclosure.
Figure 4B:
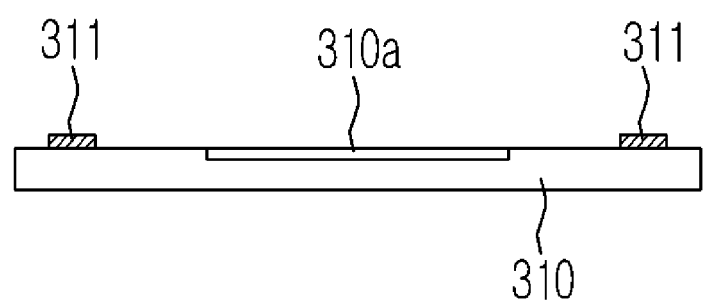

FIG. 4A illustrates a plane view of an image sensor chip 310 forming the image sensor package in accordance with an embodiment of the present disclosure, and FIG. 4B is a cross-sectional view according to the A-A' line illustrated in FIG. 4A.

As illustrated FIG. 4A and FIG. 4B, the image sensor chip 310 may be provided at a central portion of an upper surface thereof with the pixel domain 310*a*, and at an outer side of the pixel domain 310*a* thereof with the plurality of solder bump pads 311.

Figure 4C:
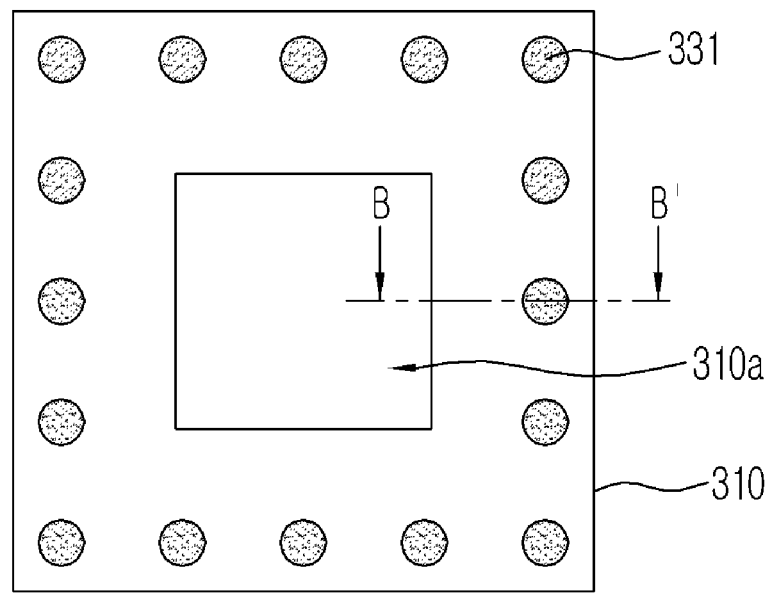
Figure 4D:
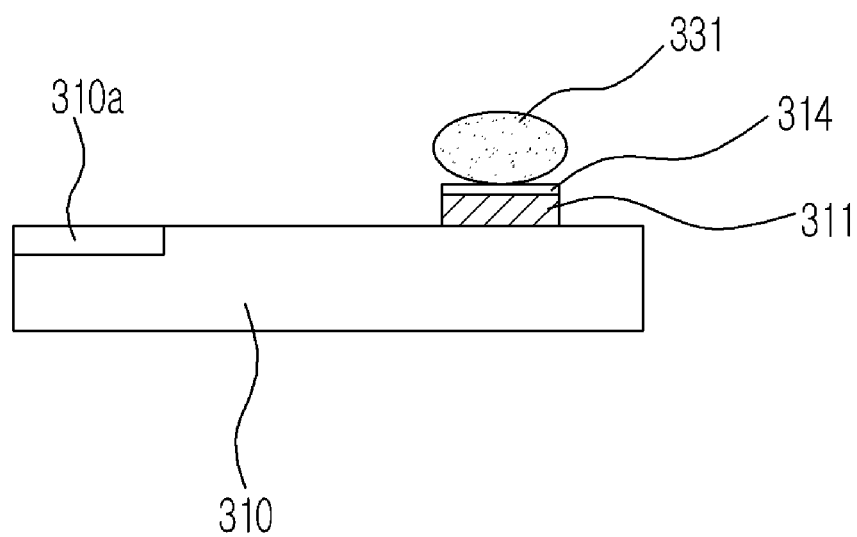

FIG. 4C is a plane view illustrating the solder bumps 331 formed on the image sensor chip 310 forming the image sensor package 300 in accordance with an embodiment of the present disclosure, and FIG. 4D is a cross-sectional view according to the B-B' line illustrated in FIG. 4C.

As illustrated on FIG. 4C and FIG. 4D, after forming an UBM (Under Bump_Metallugy) 314 on the solder bump pads 311 of the image sensor chip 320 to strengthen the adhesiveness with respect to the solder bumps 331, the solder bumps 331 are formed on the UBM 314. The UBM 314 may be formed through a metallic film deposition by use of an evaporation method or a sputtering method, as well as through a patterning by use of polymer. The patterning using polymer may be preceded, after coating liquid-state polymer, by performing a patterning through a lithography process or by performing a drying method.

Use of a material such as Ni or Au, which is configured to electrically connect in between the solder bump pads 311 and the circuit pattern of the substrate 320, both of which are of Al material, while capable of performing a stable attachment in a mechanical manner, may be used as a material for the solder bumps 331. The solder bumps 331 may be formed through an evaporation method, an electroplating method, an electroless plating method, a stencil printing method, a jet printing method, or a pick and place method.

Figure 4E:
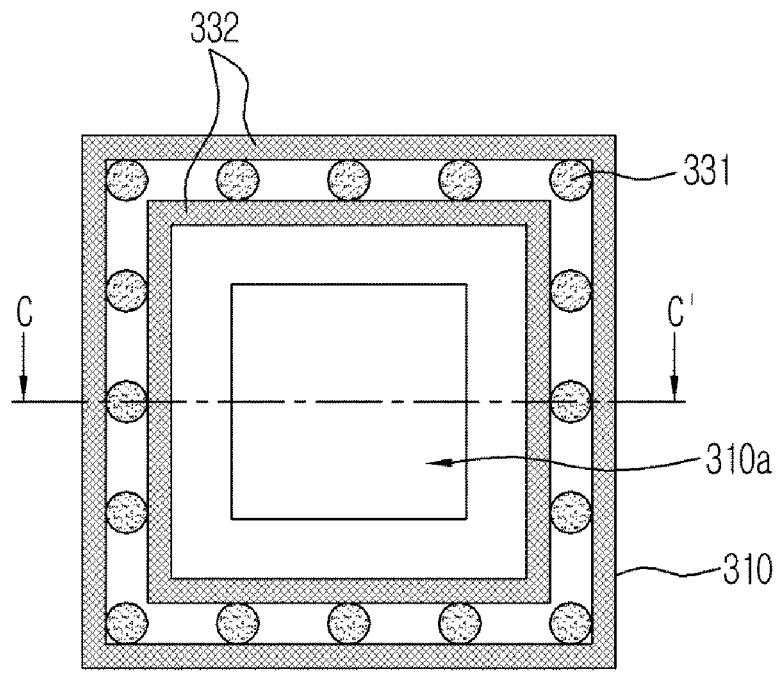
Figure 4F:
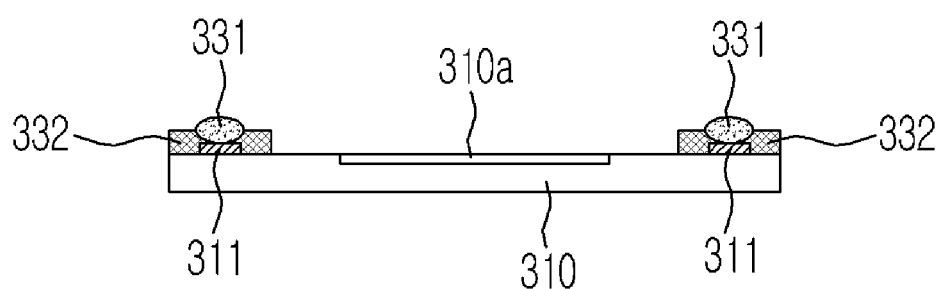

FIG. 4E is a plane view of the sealing resin 332 formed on the image sensor chip 310 structuring the image sensor package 300 in accordance with an embodiment of the present disclosure, and FIG. 4F is a cross-sectional view according to C-C' line illustrated in FIG. 4E.

As illustrated in FIG. 4E and FIG. 4F, the sealing resin 332 having a predetermined width and height may be formed at a domain of the image sensor chip 310 at a surrounding area of the solder bump pads 311 at which the solder bumps 331 are formed. The sealing resin 332 is configured to prevent the pixel domain 310*a* from being contaminated, for example, by the excessive flow of the bump material. A material being cured by heat or the UV may be applied, and in addition, the use of the material maintaining thermal, optical and physical characteristics stable during the packing process may be used as a material for the sealing resin 332.

Figure 4G:
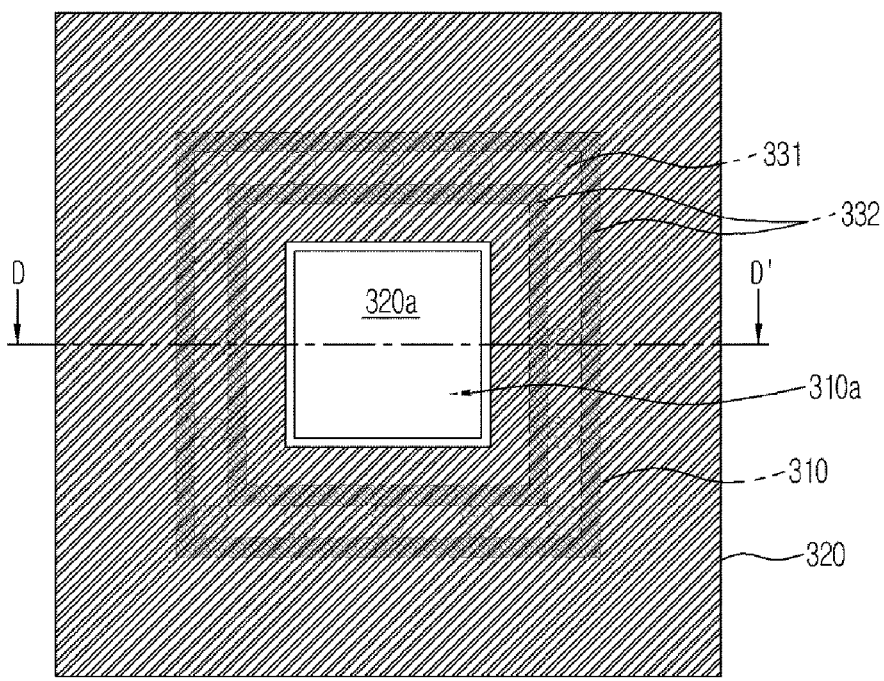
Figure 4H:
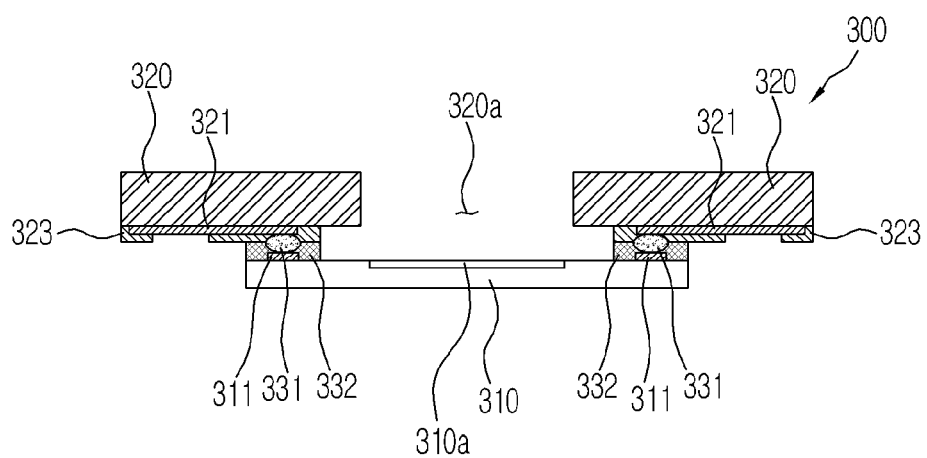

FIG. 4G is a plane view illustrating the image sensor chip 310 forming the image sensor package 300 in accordance with an embodiment of the present disclosure, the image sensor chip being flip-chip bonded to the substrate 320, and FIG. 4H is a cross-sectional view according to D-D' line illustrated on FIG. 4G.

As illustrated in FIGS. 4G and 4H, the image sensor chip 310 is flip-chip bonded to the substrate 320, at which a circuit pattern (not shown) is formed using the solder bump 311 and the hole 320*a* having a size sufficient enough to expose the pixel domain 310*a* of the image sensor chip 310 is formed. The substrate 320 may be disposed on the sealing resin 332.

Figure 4I:
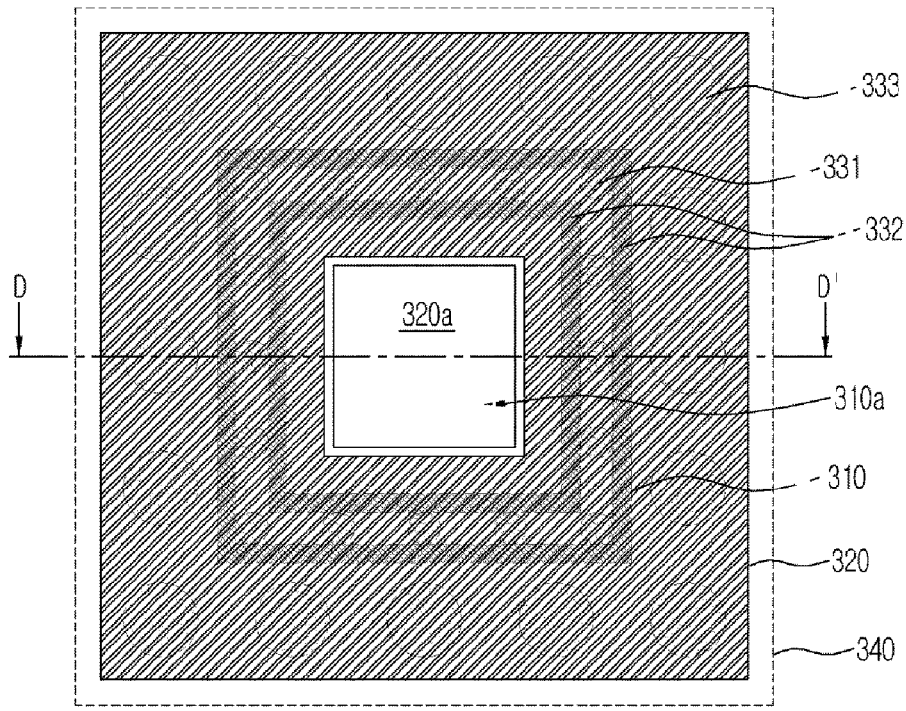
Figure 4J:
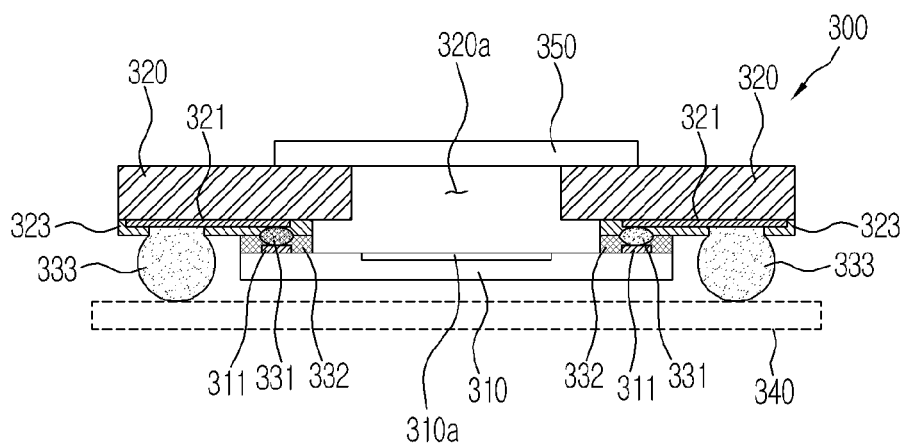

FIG. 4I is a plane view illustrating the substrate 320, at which the image sensor chip 310 forming the image sensor package 300 in accordance with an embodiment of the present disclosure is mounted, is being mounted at the printed circuit board 340, and FIG. 4J is a cross-sectional view according to E-E' line illustrated on FIG. 4I.

As illustrated in FIG. 4I and FIG. 4J, the substrate 320, at which the image sensor chip 310 is mounted and at which the hole 320*a* provided at a position corresponding to the pixel domain 310*a* of the image sensor chip 310 is formed, may be electrically connected to the printed circuit board 340, at which a circuit pattern (not shown) is formed, by use of the solder balls 333. The transparent substrate 350 formed of glass-like material coated with an IR cutoff filter (not shown) may be attached to the substrate 320 at which the image sensor chip 310 is mounted.

Figure 5:
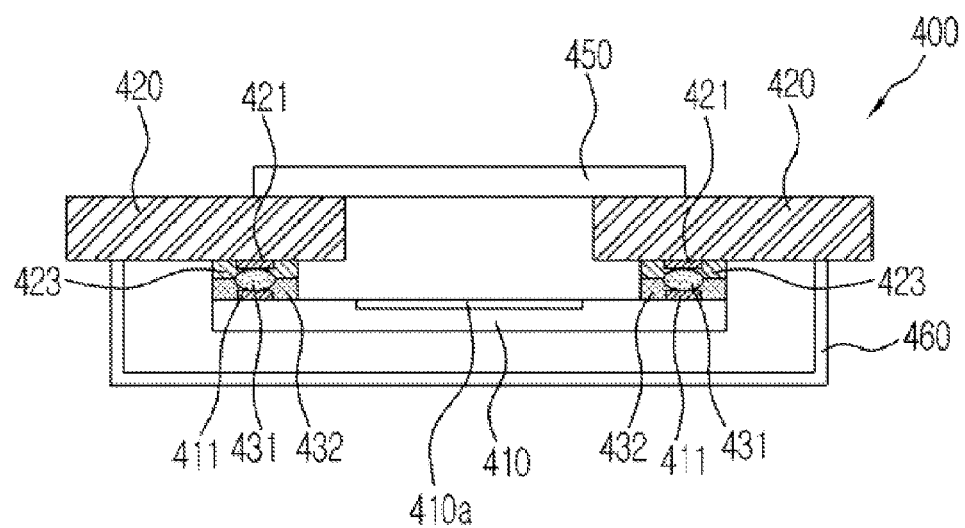
FIG. 5 is a cross-sectional view of an exemplary image sensor package in accordance with an embodiment of the present disclosure.

FIG. 5 is a cross-sectional view of an image sensor package in accordance with an embodiment of the present disclosure.

As illustrated on FIG. 5, an image sensor package 400 in accordance with an embodiment of the present disclosure largely includes an image sensor chip 410, a substrate 420 disposed at an upper side of the image sensor chip 410 to be flip-chip bonded to the image sensor chip 410, a transparent substrate 450 formed of glass-like material having an IR cutoff filter (not shown) coated thereto, and a protective case 460 configured to protect the image sensor chip 410 and the solder part 400 from an outside physical impact. For the material of the protective case 460, a plastic or a metallic material capable of elastically deforming with respect to an outside physical impact may be used.

According to an embodiment of the present disclosure, the substrate 420 at which the image sensor chip 410 may be mounted formed of organic material and applied with multi-layer interconnection technology, so that the driving voltage and the current of an outside that are needed at the image sensor chip 410 may be directly supplied to the image sensor chip 410 through the substrate 420. That is, according to an embodiment of the present disclosure, by using the substrate 420 applied with multi-layer interconnection technology, the solder balls, which are configured to electrically connect the printed circuit board to the substrate at which the printed circuit board and the image sensor chip are mounted, in the image sensor package may be omitted. With respect to the image sensor package 400 in accordance with an exemplary embodiment of the present disclosure, since the printed circuit board is omitted, the image sensor package 400 may be manufactured at a thinner thickness when compared to the thickness of an image sensor package that includes a printed circuit board.

With respect to the image sensor package 400 in accordance with an embodiment of the present disclosure, other components, except for the protective case 460, may be are same as the components of the image sensor package in accordance with an embodiment of the present disclosure illustrated in FIG. 3, and thus the detailed descriptions thereof are omitted.

Although a few embodiments of the present disclosure have been shown and described, it would be appreciated by those skilled in the art that changes may be made in these embodiments without departing from the principles and spirit of the disclosure, the scope of which is defined in the claims and their equivalents.

What is claimed is:

1. An image sensor package, comprising:
an image sensor chip provided with a pixel domain formed at a central portion of an upper surface thereof;
a substrate disposed at an upper side of the image sensor chip so as to be flip-chip bonded to the image sensor chip, provided with a hole formed at a position facing the pixel domain, and formed of an organic material;
a printed circuit board at which the substrate having the image sensor chip bonded thereto is mounted;
a solder ball configured to electrically connect the substrate to the printed circuit board; and;
a sealing resin between the image sensor chip and the substrate to prevent foreign substance from being introduced to an inside the pixel domain of the image sensor chip,
wherein the substrate comprises a transparent substrate and an IR cutoff filter configured to transmit or block light having a particular wavelength band attached to an upper surface of the substrate.

2. The image sensor package of claim 1, wherein:
the organic material has a coefficient of thermal expansion similar to a coefficient of a silicon wafer material, and is capable of elastic deformation.

3. The image sensor package of claim 1, wherein:
the image sensor chip comprises a solder bump pad formed at an outer side of the pixel domain.

4. The image sensor package of claim 3, further comprising:
a solder bump formed on the solder bump pad of the image sensor chip, wherein the image sensor chip is flip-chip bonded to the substrate by the solder bump.

5. The image sensor package of claim 4, wherein the sealing resin being formed at a surrounding area of the solder bump between the image sensor chip and the substrate.

6. The image sensor package of claim 1, wherein:
the IR cutoff filter is coated on a surface of the transparent substrate.

7. An image sensor package, comprising:
an image sensor chip provided with a pixel domain at a central portion of an upper surface thereof;
a substrate disposed at an upper side of the image sensor chip so as to be flip-chip bonded to the image sensor chip, provided with a hole formed at a position corresponding to the pixel domain, provided with multilayer interconnection formed thereto, and formed of an organic material;
a protective case formed at a lower surface of the substrate to protect the image sensor chip; and
a sealing resin between the image sensor chip and the substrate to prevent foreign substance from being introduced to an inside the pixel domain of the image sensor chip
wherein the substrate comprises a transparent substrate and an IR cutoff filter configured to transmit or block light having a particular wavelength band attached to an upper surface of the substrate.

8. The image sensor package of claim 7, wherein:
the organic material has a coefficient of thermal expansion similar to a coefficient of thermal expansion of a silicon wafer material, and capable of elastic deformation.

9. The image sensor package of claim 7, wherein:
the image sensor chip comprises a solder bump pad formed at an outer side of the pixel domain.

10. The image sensor package of claim 9, further comprising:
a solder bump formed on the solder bump pad of the image sensor chip, wherein the image sensor chip is flip-chip bonded to the substrate by the solder bump.

11. The image sensor package of claim 10, wherein the sealing resin being formed at a surrounding area of the solder bump in between the image sensor chip and the substrate.

12. The image sensor package of claim 7, wherein:
the IR cutoff filter is coated on a surface of the transparent substrate.

* * * * *

UNITED STATES PATENT AND TRADEMARK OFFICE
CERTIFICATE OF CORRECTION

| | | |
|---|---|---|
| PATENT NO. | : 9,024,403 B2 | Page 1 of 1 |
| APPLICATION NO. | : 13/870453 | |
| DATED | : May 5, 2015 | |
| INVENTOR(S) | : Tae Sang Park et al. | |

It is certified that error appears in the above-identified patent and that said Letters Patent is hereby corrected as shown below:

In the claims

Claim 1, Column 9, Line 17

Delete "and;" and insert --and--, therefor.

Signed and Sealed this
Thirteenth Day of October, 2015

Michelle K. Lee
*Director of the United States Patent and Trademark Office*